United States Patent
Gay (10) Patent No.: US 6,188,975 B1
(45) Date of Patent: Feb. 13, 2001

(54) PROGRAMMATIC USE OF SOFTWARE DEBUGGING TO REDIRECT HARDWARE RELATED OPERATIONS TO A HARDWARE SIMULATOR

(75) Inventor: Donald L. Gay, Pleasanton, CA (US)

(73) Assignee: Synopsys, Inc., Mountain View, CA (US)

( * ) Notice: Under 35 U.S.C. 154(b), the term of this patent shall be extended for 0 days.

(21) Appl. No.: 09/053,327

(22) Filed: Mar. 31, 1998

(51) Int. Cl.$^7$ .............................. G06F 17/50; G06F 9/455

(52) U.S. Cl. .............................................. 703/22; 703/26

(58) Field of Search ........................... 716/5, 18; 703/13, 703/14, 17, 22, 23, 27, 28, 26

(56) References Cited

U.S. PATENT DOCUMENTS

| | | | |
|---|---|---|---|
| 4,736,338 | 4/1988 | Saxe et al. ............................. | 703/15 |
| 4,989,209 | 1/1991 | Littlebury et al. .................... | 714/724 |
| 5,001,714 | 3/1991 | Stark et al. ........................... | 714/737 |
| 5,111,413 | 5/1992 | Lazansky et al. ...................... | 703/14 |
| 5,115,191 | 5/1992 | Yoshimori ............................. | 714/724 |
| 5,418,728 | 5/1995 | Yada ..................................... | 700/97 |
| 5,452,225 | 9/1995 | Hammer ................................ | 703/19 |
| 5,465,335 | 11/1995 | Anderson ............................. | 709/107 |
| 5,493,507 | 2/1996 | Shinde et al. .......................... | 703/14 |
| 5,544,348 | 8/1996 | Umeda et al. .......................... | 703/17 |
| 5,546,562 | * 8/1996 | Patel ...................................... | 703/14 |

(List continued on next page.)

FOREIGN PATENT DOCUMENTS

WO 95/26000   9/1995   (WO) .............................. G06F/9/455

OTHER PUBLICATIONS

Viewlogic Systems, Inc., "Windows®CE Design with Workview Office® Overview," 1996.
Beihl, Gary, "Shared–Memory Multiprocessor Logic Simulator", 1989, IEEE, pp. 26–28.
Brown et al., "Issues in the design of a logic simulator: an improved caching technique for event–queue management", Oct. 1995, IEE Proc.–Circuits Devices Syst., vol. 142, No. 5, pp. 293–298.
D. Becker et al., *An Engineering Environment for Hardware/Software Co–Simulation,* Design Automation Conference, 29th ACM/IEEE Proceedings, 1992, pp. 129–134.*
J. Wilson, *Hardware/Software Selected Cycle Solution,* Proceedings of the Third International Workshop on Hardware/Software Codesign, 1994, pp. 190–194.*

(List continued on next page.)

*Primary Examiner*—Kevin J. Teska
*Assistant Examiner*—Russell W. Frejd
(74) *Attorney, Agent, or Firm*—D'Alessandro & Ritchie (57) ABSTRACT

The present invention is a method that uses breakpoints in a debugging program to signify to a hardware software co-verification tool when to redirect hardware calls to a hardware simulator. The method includes executing a line of software code within a software component, determining whether the line of software code requires interaction with a hardware device, associating the line of software code with an interface module if the line of software code requires interaction with a hardware device, simulating the hardware device with a hardware model running under simulation, using the interface module to request a hardware operation from the hardware model when the line of software code requires a hardware operation; and providing data generated by the hardware model running under simulation in response to the request.

27 Claims, 5 Drawing Sheets

U.S. PATENT DOCUMENTS

| | | | |
|---|---|---|---|
| 5,553,008 | | 9/1996 | Huang et al. ............................ 703/14 |
| 5,610,833 | | 3/1997 | Chang et al. ........................... 716/11 |
| 5,613,098 | | 3/1997 | Landau et al. .......................... 703/20 |
| 5,623,418 | | 4/1997 | Rostoker et al. ........................ 716/1 |
| 5,633,812 | | 5/1997 | Allen et al. ............................. 703/15 |
| 5,652,869 | | 7/1997 | Herdeg et al. .......................... 703/23 |
| 5,678,028 | * | 10/1997 | Bershteyn et al. ...................... 703/22 |
| 5,680,584 | | 10/1997 | Herdeg et al. .......................... 703/22 |
| 5,768,567 | * | 6/1998 | Klein et al. ............................. 703/13 |
| 5,771,370 | * | 6/1998 | Klein ...................................... 703/13 |
| 5,838,948 | | 11/1998 | Bunza .................................... 703/27 |
| 5,870,588 | * | 2/1999 | Rompaey et al. ...................... 703/13 |
| 5,911,059 | * | 6/1999 | Profit, Jr. ............................... 703/23 |
| 5,913,052 | | 6/1999 | Beatty et al. ........................... 703/15 |
| 5,960,182 | * | 9/1999 | Matsuoka et al. ...................... 703/17 |
| 6,009,256 | * | 12/1999 | Tseng et al. ............................ 703/13 |

OTHER PUBLICATIONS

C.A. Valderrama et al., *Automatic Generation of Interfaces for Distributed C–VHDL Cosimulation of Embedded Systems: an Industrial Experience,* 7th IEEE Int'l Workshop on Rapid System Prototyping, Proceedings, 1996, pp. 72–77.*

A. Allara et al., Improving Design Turnaround Time via Two–Levels HW/SW Co–Simulation, 1997 IEEE Int'l Conference on Computer Design, VLSI in Computers and Processors, ICCD '97 Proceedings, pp. 400–405.*

J. Marcotte et al., An Approach to the Design of a Deterministic Jitter–Free Dual–Chamber Brady Pacer in an ICD Using Hardware and Software Cooperation, Computers in Cardiology, 1998, pp. 549–552.*

* cited by examiner

PROGRAMMATIC USE OF SOFTWARE DEBUGGING TO REDIRECT HARDWARE RELATED OPERATIONS TO A HARDWARE SIMULATOR

STATEMENT OF RELATED APPLICATIONS

This application claims subject matter related to the subject matter claimed in co-pending application bearing application Ser. No. 09/053,140 filed on Mar. 31, 1999.

BACKGROUND OF THE INVENTION

1. Field of the Invention

The present invention relates to hardware software co-verification. More particularly, the present invention relates to using breakpoints in a debugging program to signify to a hardware software co-verification tool when to redirect hardware calls to a hardware simulator.

2. The Background Art

Embedded systems are by definition special purpose or customized devices controlled by a computer system through software application programs and hardware drivers which run on some form of operating system such as Windows CE from Microsoft Corporation of Redmond, Wash., Solaris 2.6 from Sun Microsystems of Mountain View, Calif., or VxWorks from Windriver of Alameda, Calif. Through software control these embedded systems are customized to provide a variety of features, forming a very broad market for these devices. For example, embedded systems include set-top boxes for cable, satellite, and Internet T.V. use, personal information managers, or any smart device created using a computer system such as a smart dishwasher. Specific examples of an embedded system are the 320LX™ hand-held PC from Hewlett Packard of Cupertino, Calif., the PILOT® personal information manager (PIM) from 3COM, the AutoPC from Volkswagen AG of Stuttgart, Germany, or any other device having a processor and peripheral hardware devices that run under software control.

Figure 1:
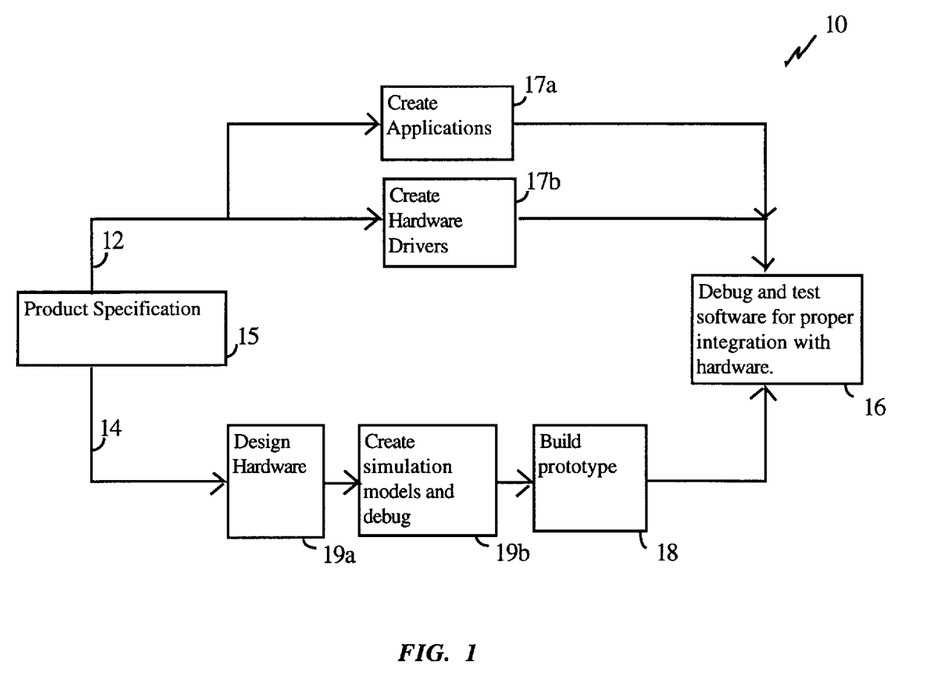
FIG. 1 is a flow chart of a typical process flow for developing an embedded system.

FIG. 1 shows a typical process flow 10 for developing an embedded system. Process flow 10 is bifurcated into a software design flow 12 and hardware design flow 14, where both flows develop separately according to a common specification 15. The testing and verification of software 16, such as an application program 17a and/or hardware drivers 17b, do not occur until a suitable hardware prototype, such as through an ASIC, (Application Specific Integrated Circuit), is created at the hardware creation stage 18 (which is preceded by design hardware stage 19a and create simulation models and debug stage 19b). Waiting to test the software and hardware portions until a hardware prototype has been created extends the overall design cycle if re-work is required to make the software and hardware components compatible with each other.

One method known for detecting design flaws early in the process integrates the development of the software and hardware early in the development path by performing software debugging and verification before an actual working hardware prototype is completed. This approach provides the opportunity for a shorter time to market and higher product quality since testing may be accomplished through either a hardware or software solution (or both), and before any time and money is spent developing a physical implementation that may not be compatible with the software components developed.

This approach requires that the hardware product be emulated/simulated from design (behavioral and/or functional) models while the software product is also being simulated. One such testing apparatus is described in an International Application published under the Patent Cooperation Treaty (PCT) on behalf of inventor John Wilson, having an international publication number WO 95/26000, hereinafter referred to as the Wilson reference. In the Wilson reference, software code that is intended to interact with hardware, such as a software driver, is replaced with high level interface functions from an interface library during testing. However, replacing actual software code with high level interface functions does not accurately simulate the integration between the software and hardware components because replacing actual code with test code results in a program flow different from that if the actual code was actually used to interact with the hardware.

Accordingly, a need exists where hardware software co-verification is performed that accurately simulates the interaction between software code that interacts with the hardware device, such as a software driver, and a simulated hardware device without substituting the original software code with test code or without changing the execution flow of the original software code.

SUMMARY OF THE INVENTION

The present invention is a method that uses breakpoints in a debugging program to signify to a hardware software co-verification tool when to redirect hardware calls to a hardware simulator. The method includes executing a line of software code within a software component, determining whether the line of software code requires interaction with a hardware device, associating the line of software code with an interface module if the line of software code requires interaction with a hardware device, simulating the hardware device with a hardware model running under simulation, using the interface module to request a hardware operation from the hardware model when the line of software code requires a read operation; and providing data generated by the hardware model running under simulation in response to the request.

DETAILED DESCRIPTION OF THE PREFERRED EMBODIMENTS

Those of ordinary skill in the art will realize that the following description of the present invention is illustrative only and not in any way limiting. Other embodiments of the invention will readily suggest themselves to such skilled persons.

System

Figure 2:
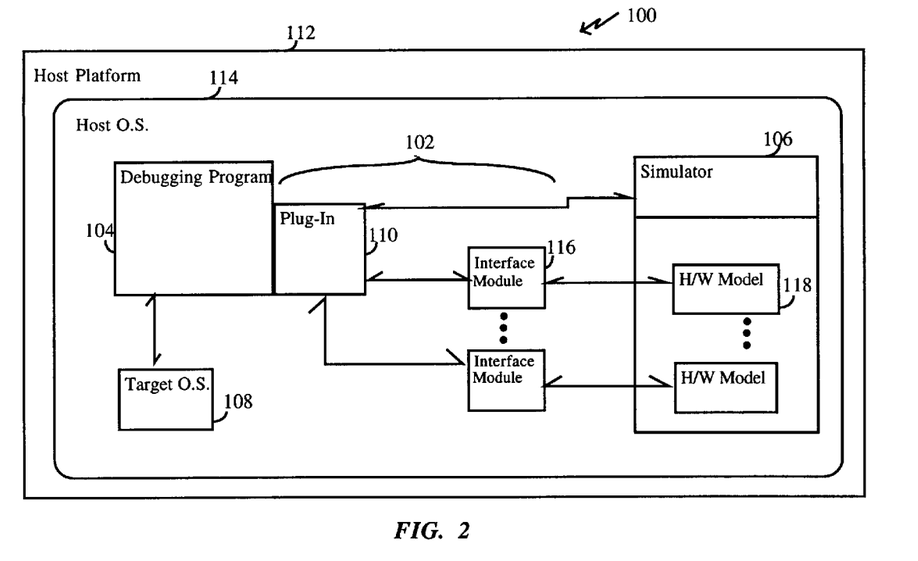
FIG. 2 is a block diagram of a system that performs hardware software co-verification by diverting device calls, such as hardware calls, through an interface module coupled to a hardware model running under simulation according to a presently preferred embodiment of the present invention.

FIG. 2 is a block diagram of a system that performs hardware software co-verification by diverting device calls, such as hardware calls, through an interface module coupled to a hardware model running under simulation according to a preferred embodiment of the present invention.

In a system for hardware software co-verification 100, a hardware software co-verification tool (hereinafter, co-verification tool) 102 is coupled to a debugging program 104; a hardware simulator 106; and a simulated target operating system 108. In a preferred embodiment, co-verification tool 102 includes a software application program (hereinafter, plug-in) 110 for execution by one or more processors provided by host computing platform 112 that are operating under the direction of a host operating system 114. Co-verification tool 102 also includes an interface module 116 configured to handle device operations and communications between plug-in 110 and a hardware model 118 simulated by hardware simulator 106.

In a presently preferred embodiment, host computing platform 112 includes a conventional processor having program and data memory, mass storage, a keyboard and pointing device or other input devices, and a display or other output devices (not shown). The processor operates under control of host operating system 114 and applications software stored using the mass storage and copied to the program memory for normal operation, operates upon library data structures stored using the mass storage and copied to the data memory for use, and operates upon temporary and output data structures stored in data memory and copied to the mass storage or displayed for outputs as appropriate.

For example, host computing platform 112 may preferably include an Intel Pentium II processor having at least 32 megabytes of RAM (Random Access Memory) and 3gigabytes of mass storage, which operate under control of Microsoft Windows NT 4.0 operating system and under control of applications software that perform the method steps described herein.

In an alternative embodiment, host computing platform 112 may include a SUN Microsystems "SPARCstation 20" workstation, having 64 megabytes of RAM and 4 gigabytes of mass storage, operating under control of Solaris 2.6 operating system and under control of applications software that perform the method steps described herein. Solaris 2.6 is available from Sun Microsystems of Mountain View, Calif.

The hardware software co-verification system 100 allows a user to test software code intended for integration with a hardware device, such as a software driver, without having to use an actual physical implementation of the hardware device to provide the relevant signals, such as timing and data signals, expected by the software code. This includes flagging with a breakpoint each line of software code that requires some form of hardware interaction although in an alternative embodiment a user may insert each breakpoint manually. During software execution, lines of software code that do not require some form of hardware device interaction, i.e., lines of code that are not flagged with a breakpoint, are directed by the debugging program to interact with simulated target operating system 108, while all lines of software code that have a breakpoint are intercepted by plug-in 110 for servicing through hardware simulation.

The lines of software code that have a breakpoint and that are intercepted by plug-in 110 for servicing through hardware simulation are not replaced, substituted or modified in any manner, but are instead serviced through hardware simulation corresponding interface modules. This approach inherently avoids having to go through a target operating system to provide the needed interaction with a hardware device. Not having to use a target operating system when servicing hardware calls, in turn, avoids having to provide a target processor to run the target operating system. This is an added benefit since a target processor does not have to be provided (either an actual processor or one running under simulation) to achieve using software hardware co-verification. Moreover, since the software code is not replaced with test code, there is no need to cross-compile the software code to run on the target processor.

When a breakpoint is encountered by debugging program 104, plug-in 110 determines what type of hardware device, if any, is being sought for interaction with the software code, chooses a hardware model that is appropriate for modeling the hardware device sought, and chooses an interface module to act as an interface with the chosen hardware model during simulation of the hardware model. In a presently preferred embodiment, one interface module is used for each type of hardware model that simulates a particular hardware device. Although in an alternative preferred embodiment, a generic interface module may be used that is compatible with more than one hardware model, with each hardware model simulating a different hardware device.

Once the expected hardware operation is completed, debugging program 104 returns to the next line of code. Thus, an actual physical implementation of the hardware component is not used but is substituted with a hardware model of that hardware component. The hardware model is simulated to provide the expected functional and behavioral patterns of the hardware component in response to the execution of the software code. An interface module is used to integrate the hardware model and software code, enabling the hardware operations called for by the software to be acted upon through simulation of the hardware model. Those of ordinary skill in the art will readily realize how to generate the hardware models for particular hardware devices without undue experimentation.

Debugging program 104 is any software debugging program capable of running on a chosen host operating system, communicating with plug-in 110, providing a communication interface with a selected target operating system, such as an operating system kernel, so that breakpoints and interrupts related to the software being debugged may be processed by hardware software co-verification system 100. As known in the art, a breakpoint is a flag set by a user or through program control, and is interpreted by a debugging program to stop the execution of a software program at a line of software code having the flag.

According to a presently preferred embodiment of the present invention, debugging program 104 includes the software product Visual Studio, available from Microsoft Corporation of Redmond, Wash. Visual Studio (or an equivalent product) is integrated with kernel debugging unit (not shown) which enables Visual Studio to have the functionality to debug a software program using breakpoints, to handle interrupts from hardware devices, and to communicate with plug-in 110. This preferred embodiment is not intended to limit the present invention in any way, but is simply intended to show one possible implementation that may be used to practice the present invention by those skilled in the art.

Hardware simulator 106 is any simulator that can simulate the behavior of a hardware device using a hardware model created for that device and that has an interface for connecting to and communicating with another a software component, such as plug-in 110, using a binary standard for software component interoperability. As defined herein, the term interoperability is intended to include the ability for a software component to connect, communicate and/or control (such as through the passing of function calls) with another software component. The hardware model may include a functional and/or description of the hardware device or any type of hardware description language (HDL). According to a presently preferred embodiment, the hardware simulator is "Fusion VCS," available from Synopsys, Inc., of Mountain View, Calif., and is configured to use hardware models in the VHDL or Verilog HDL format.

Hardware simulator 106 and plug-in 110 connect to and communicate with each other using a binary standard for software component interoperability, enabling plug-in 110 to start, stop, and control the simulation environment provided by hardware simulator 106. For example, plug-in 110 includes functionality for starting hardware simulator 106 and instructing hardware simulator 106 to load the appropriate hardware design models and begin simulation. In addition, plug-in 110 may also be configured to integrate into one user interface any messages generated by hardware simulator 106 by routing the messages to the user interface.

The binary standard for software component interoperability enables software components, such as hardware simulator 106 and plug-in 110, to connect to and communicate with each other in a well-defined manner. This includes supporting multiple operating system platforms, using a single programming model for components to communicate within the same process, and also across process and network boundaries, providing for a error and status reporting, and allowing for dynamic loading and unloading of components.

A software component as used herein is defined as including a piece of compiled code that provides some service to the rest of the system, such as functions within plug-in 110.

In accordance with a presently preferred embodiment of the present invention, component interoperability is provided through "COM," which is a general software architecture known in the art. Windows NT 4.0, Windows 95, Apple Macintosh, and many varieties of UNIX operating systems support COM (Component Object Model) and thus enable software components to connect to and communicate with each other in a well-defined manner. Other types of software component interoperability methods may be used in the present invention, such as pipes, which is another commonly known interoperability method between software components.

Target operating system 108 is any operating system that strongly specifies the type of device calls and the manner in which such calls are made to hardware and vice versa. In accordance with a presently preferred embodiment, target operating system 108 includes a HAL (Hardware Abstraction Layer) such as that found in the Windows CE (or equivalent product). The HAL enables the Windows CE operating system to strongly specify to a software application, or similar hardware dependent software such as a device driver, the type and manner of hardware calls that the application may make to a hardware device. Any direct calls to hardware from an application running on the operating system are forbidden. By assuming that software and hardware developers will abide with the abstraction layer as a design constraint, an interface module may be designed to interface directly to a hardware model running under simulation. This allows software code requiring some form of device interaction to be serviced directly by a hardware model running under simulation through an interface module. This enables co-verification of software code requiring device interaction without the need to simulate/emulate a processor model. Consequently, when a line of software code in a software driver undergoing debugging makes a call to a hardware device, the call is detected and redirected by plug-in 110 to an appropriate interface module coupled to a corresponding hardware model undergoing simulation. Or if the hardware model under simulation requires some form of software response through an interrupt signal, the corresponding interface module services the interrupt signal by redirecting it to the simulated target operating system.

In a presently preferred embodiment of the present invention, Windows CE (or an equivalent product), as target operating system 108, is implemented by running on host operating system 114 the SDK (Software Developer's Kit) for Windows CE, which is available from Microsoft Corporation of Redmond, Wash. Since in the presently preferred embodiment the target operating system is Windows CE, the term target operating system include the Windows CE kernel compiled to include an OEM (Original Equipment Manufacturer) adaptation layer created by the developer. The OEM adaptation layer is preferably built by the developer using Windows CE OAK (OEM Adaptation Kit), while any installable device drivers created are developed using Windows CE DDK (Device Driver Kit). Other types of development kits may be used as understood by those reasonably skilled in the art and the above preferred embodiments are not intended to limit the present invention. For example, Windows CE Toolkit for Visual Basic or Windows CE Toolkit for C++ may also be used by developers who use Visual Basic or Visual C++, respectively, to build software applications intended for use with an embedded system running Windows CE as its operating system.

Note that in an alternative embodiment, Windows CE ETK (Embedded Tool Kit) may be used in lieu of Windows CE OAK to build the OEM adaptation layer. Windows CE ETK limits developers to building a version of the Windows CE kernel tethered to the host operating system, unlike Windows CE OAK. Thus, Windows CE OAK is required if a developer seeks to develop a version of Windows CE having a kernel that can be distributed.

Figure 3:
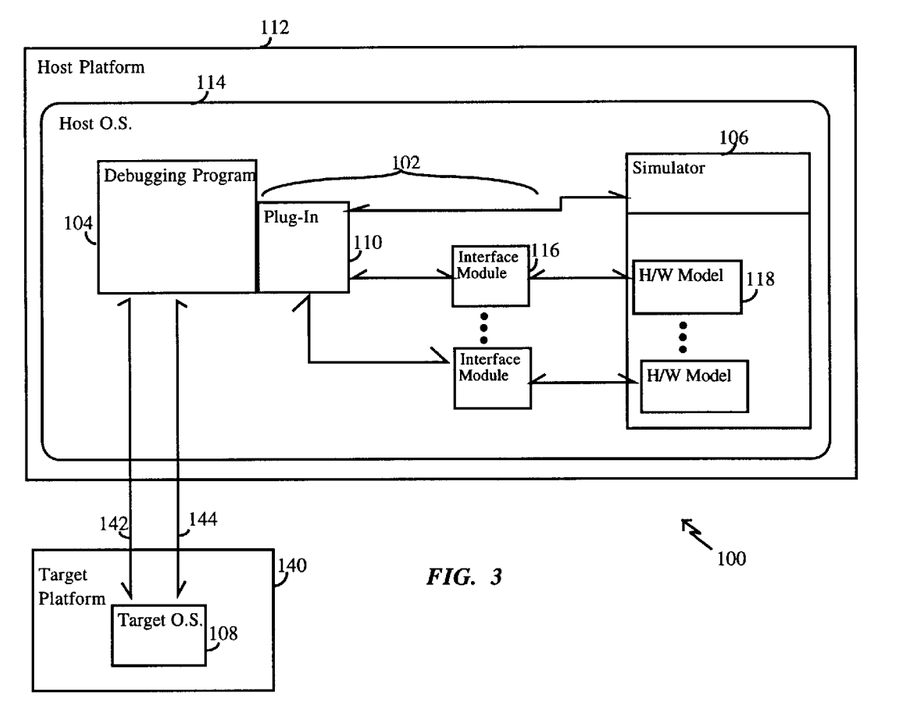
FIG. 3 is a block diagram of a system that performs hardware software co-verification by diverting device calls, such as hardware calls, through an interface module coupled to a hardware model running under simulation and by using a separate platform to run a target operating system according to an alternative embodiment of the present invention.

FIG. 3 shows a block diagram of a system that performs hardware software co-verification by diverting device calls, such as hardware calls, through an interface module coupled to a hardware model running under simulation and by using a separate platform to run a target operating system according to an alternative embodiment of the present invention.

In an alternative embodiment of the present invention, target operating system 108 may be executing on a target platform 140 separate from the host platform. For example, as shown in FIG. 3, target platform 140 may be provided by a development board coupled to debugging program 104 through a parallel port 142 and a serial port 144 provided by host computing platform 112. The ports enable debugging program 104 to execute software code with operations requiring interaction with target operating system 108 by using the ports to send and receive signals required to sustain and control the interaction between the software code being debugged and target operating system 108.

Figure 4A:
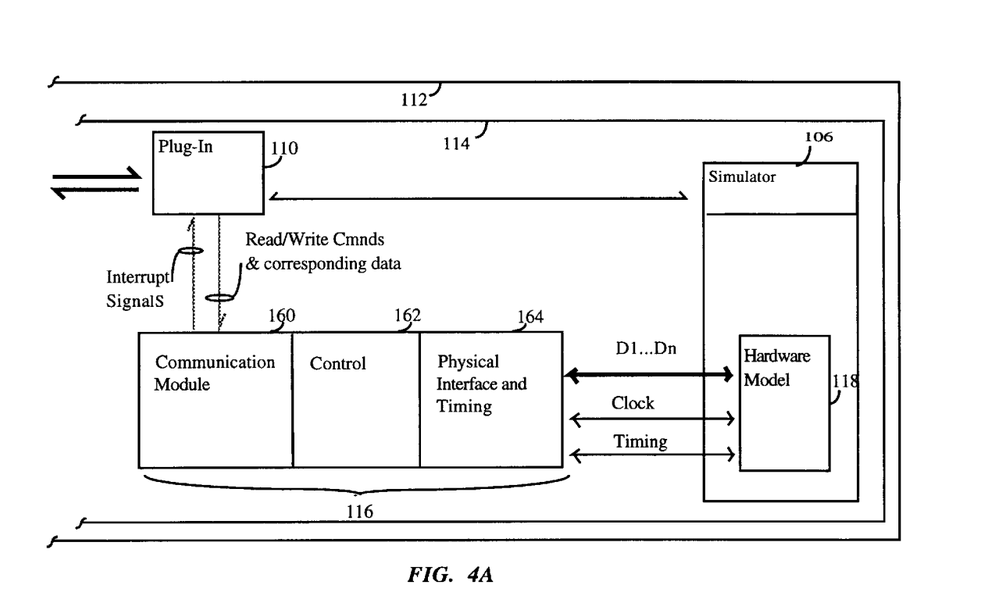
FIG. 4A is a block diagram of the components comprising an interface module for use with a plug-in and a corresponding hardware module running under simulation in a system for hardware software co-verification according to a presently preferred embodiment of the present invention.

FIG. 4A shows a block diagram of the components comprising an interface module for use with a plug-in and a corresponding hardware module running under simulation in a system for hardware software co-verification according to a preferred embodiment of the present invention.

Interface module 116 includes a communication portion 160, a control portion 162, and a physical interface and timing portion 164. Through program control communication portion 160 is configured to receive a hardware call, such as a read or write operation and corresponding data and addresses from plug-in 110 after plug-in 110 detects a hardware call from a line of software code having a breakpoint and after plug-in 110 has chosen an interface module 116 and a hardware module 118 suitable for responding to the hardware call. In a preferred embodiment of the present invention, communication between communication portion 160 and plug-in 110 is performed through COM although other types of interoperability between software components may be used such as pipes, which is another commonly known architecture that permits software components to interoperate with each other.

Communication portion 160 is also configured under program control to a send an interrupt notification to plug-in 110 in the event an interrupt signal is received from a simulated hardware device, such as hardware model 118 running under simulation. Plug-in 110 in turn, redirects the interrupt signal to simulated target operating system 108. Interrupt notification is also through COM messaging although other types of messaging between software components may be used such as pipes.

Control portion 162, which operates under program control, unpacks the read and write commands and any corresponding data and addresses into a format suitable for assertion as I/O (Input/Output) signals by physical interface and timing portion 164 to hardware model 118, which is running under simulation. With respect to an interrupt signal received from physical interface and timing portion 164, control portion 162 formats the interrupt signal into a notification signal and forwards it to communication portion 160 for transmission to target operating system 108. In a presently preferred embodiment of the present invention COM is used although other types of interoperability between software components may be used such as pipes, which is known by those of ordinary skill in the art.

Communication between physical interface and timing portion 164 and hardware model 118 is based on the type of communication interface used by hardware model 118. For example, if hardware model 118 is based on the Verilog HDL format, communication would occur through the PLI (Programmer's Language Interface) since PLI is an interface supported by Verilog HDL. If hardware model 118 is based on the VHDL format, communication would occur through a C language interface, such as STYX which is a commonly known interface for hardware models in the VHDL format. The communication between physical interface and timing portion 164 and hardware model 118 is not intended to be limited to the above disclosed hardware model communication interfaces but are described simply to illustrate one possible embodiment of the present invention where the hardware models used are in the Verilog HDL or VHDL (Very high speed integrated circuit Hardware Description Language) format.

Figure 4B:
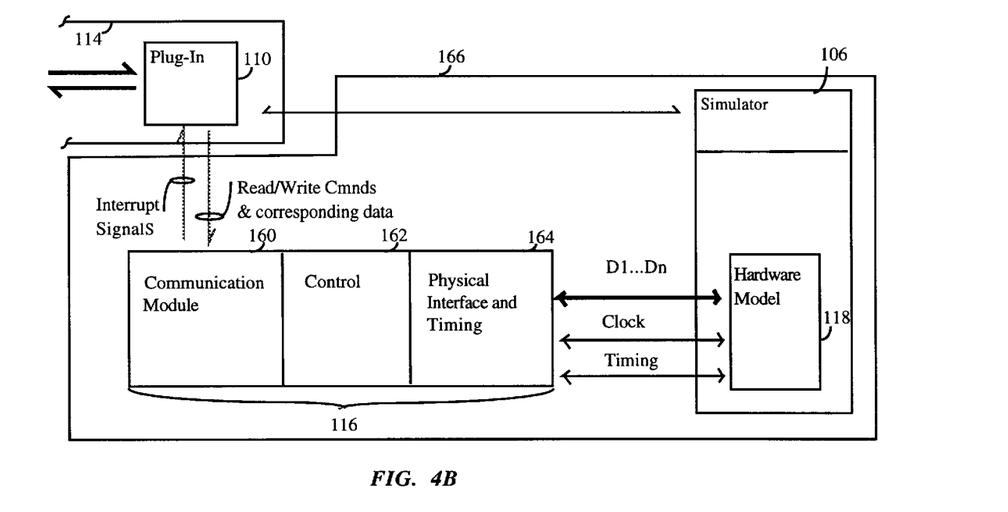
FIG. 4B is a block diagram of a system that performs hardware software co-verification in a distributed manner according to an alternative embodiment of the present invention.

FIG. 4B shows a block diagram of a system that performs hardware software co-verification in a distributed manner according to an alternative embodiment of the present invention.

In an alternative embodiment of the present invention, a distributed form of software component interoperability, such as DCOM (distributed component object model) may be used between plug-in 110 and interface module 116 and between plug-in 110 and hardware simulator 106. This enables the running of interface module 116 and hardware simulator 106 on a platform separate from the platform upon which debugging program and plug-in 110 may be running, such as host platform 112. For example, interface module 116 and hardware simulator 106 may be running on a platform 166 while debugging program 104 and plug-in 110 are running on host platform 112. Platform 166 and host platform 112 are coupled together using a physical transport layer such as a network (not shown) that supports a distributed form of software component interoperability. (Such a network would include a LAN (Local Area Network), WAN (Wide Area Network), or any switched network such as the worldwide switched network commonly referred to as the Internet.) This distributed configuration provides the advantage of distributing the computing power required to run hardware software co-verification system 100, rendering the system scalable. This results in a greater flexibility to size hardware software co-verification system 100 according to the complexity of the simulation required.

The present invention, however, is not intended to be limited to DCOM for providing software component interoperability but may use any protocol that enables software components to communicate directly over a network in a reliable and well-defined manner. This includes communication across multiple network transports, including Internet protocols such as HTTP (Hyper-Text Transfer Protocol). DCOM is based on the DCE-RPC specification, developed by the Open Software Foundation, and is commonly known by those reasonably skilled in the art.

Method of Operation

Figure 5A:
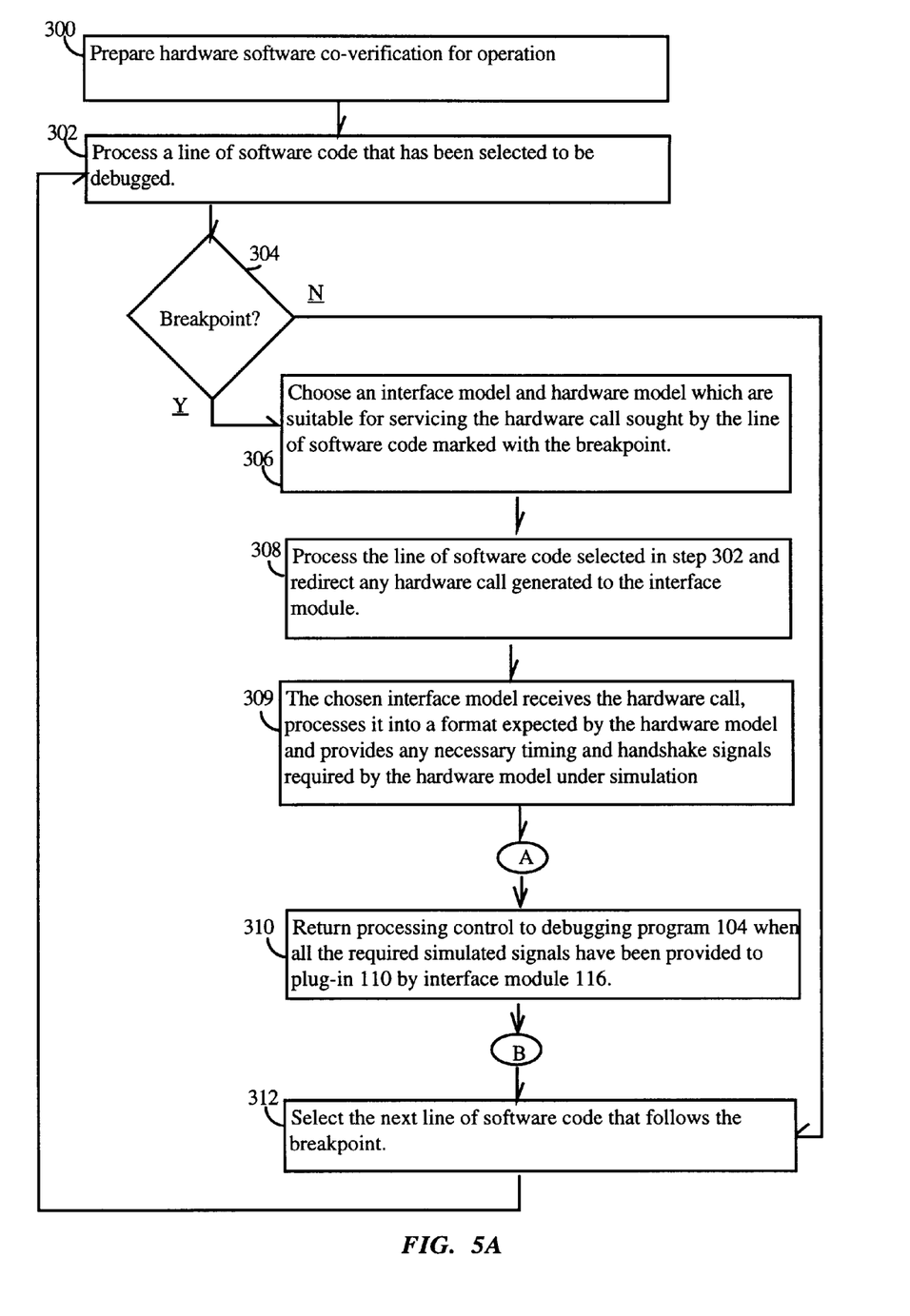
FIG. 5A is a flow chart showing the process flow of a system for hardware software co-verification according to a preferred embodiment of the present invention.

FIG. 5A shows the process flow of a system for hardware software co-verification according to a preferred embodiment of the present invention.

At step 300, hardware software co-verification system is prepared for operation. This includes a step of having a developer set breakpoints on each line of software code that will make a call to a simulated hardware device.

In an alternative embodiment of the present invention, the breakpoints may be set automatically through program control. This may include a software module (not shown) within plug-in 110 that searches each line of software code that is intended for co-verification for commands that will result in a hardware call. If such a command is found, the corresponding line of software code is flagged with a breakpoint.

Step 300 may also include starting all applicable programs running on the hardware software co-verification system by launching debugging program 104, plug-in 110, hardware simulator 106, and target operating system 108.

At step 302, debugging program 104 processes a line of software code selected for debugging.

At step 304, if a breakpoint is encountered by debugging program 104, step 306 is performed.

At step 306, plug-in 110 chooses an interface module and hardware model, such as interface module 116 and hardware model 118, which are suitable for servicing the hardware call.

At step 308, plug-in 110 processes the line of software having the breakpoint found in step 302 and redirects any hardware call generated to interface module 116.

At step 309, interface module 116 receives the hardware call and processes it into a format expected by hardware model 118 that is running under simulation. Interface module 116 also provides any necessary timing and handshake signals required by hardware model 118.

At step 310, after bypassing node A, processing is returned to debugging program 104. In the preferred embodiment of the present invention, step 310 includes waiting until all the required simulated signals have been provided to plug-in 110 through interface module 116. For example, if the hardware call required a read operation to be performed by hardware model 118, step 310 is not performed until hardware model 118 returns with the data requested by the read operation. Step 312 is then performed after bypassing node B.

At step 312, the next line of software code required for proper program flow as required by the software code being debugged is selected for processing and step 302 is performed.

If at step 304, a breakpoint was not encountered by debugging program 104, step 312 is performed.

Thus, as shown in the above steps, the present invention uses breakpoints in a debugging program to signify to a hardware software co-verification tool when to redirect hardware calls to a hardware simulator. All other lines of software code not having a breakpoint are processed normally, e.g., sent to the operating system without redirection to an interface module and/or hardware simulator.

Figure 5B:
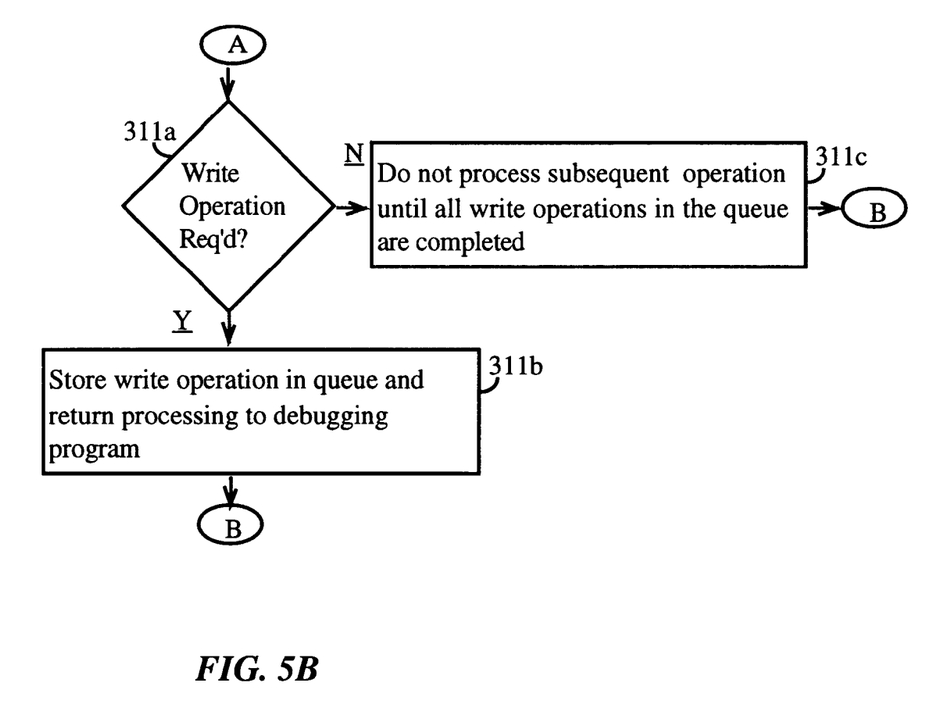
FIG. 5B is a flow chart showing the process flow of a system for hardware software co-verification according to an alternative embodiment of the present invention.

FIG. 5B is a flow chart showing the process flow of a system for hardware software co-verification according to an alternative embodiment of the present invention.

In an alternative embodiment, steps 311a–311c may be performed instead of step 310 (through node A). At step 311a, each hardware call is checked to determine whether it requires a write operation. If so, step 311b is performed. Otherwise, step 311c is performed. Finally, the process flow returns to node B, resulting in step 312 being performed, as before.

At step 311b, processing is returned to debugging program 104 (through plug-in 110) without waiting for all of the required simulation to be completed on the simulated hardware model. Step 311b also includes storing each write operation requested in a queue so that control portion 162 can retrieve the requested write operation when the respective hardware model is able to service the write operation.

At step 311c, the hardware call is not processed until all of the write operations that were queued are processed by corresponding hardware models running under simulation. Processing the hardware call includes performing steps 309–310 such as packing the operation requested by the hardware call for physical interface and timing section 164, sending the packaged signals to a respective simulated hardware model, and waiting until the simulated hardware model returns the simulated data corresponding to the read request.

The alternative embodiment as described in steps 311a–311c provides a performance increase since debugging program 104 can begin debugging the next line of software code required to be processed without waiting for the write operation to be completed by a corresponding simulated hardware model. Step 311c ensures that any subsequent read operations are performed properly by stalling each read operation until all write operations in the queue have been completed by a respective hardware model.

While embodiments and applications of this invention have been shown and described, it would be apparent to those skilled in the art that many more modifications than mentioned above are possible without departing from the inventive concepts herein. The invention therefore, is not to be restricted except in the spirit of the appended claims.

I claim:

1. A method of performing hardware software co-verification, comprising the steps of:

obtaining a software component having a plurality of lines of software code, and having at least one of said lines of software code capable of making a hardware device interaction when executed;

executing said line of software code within said software component;

flagging said line with a breakpoint, if said line requires a hardware device interaction, wherein said breakpoint for indicating said line requires said hardware device interaction when executed;

associating said line with an interface module by a plug-in, if said line requires said hardware device interaction;

simulating said hardware device with a hardware model running under simulation;

using said interface module to make a request for a hardware operation from said hardware model running under simulation when said line requires said hardware device interaction; and providing data generated by said hardware model running under simulation in response to said request.

2. The method in claim 1, wherein said data generated by said hardware model in said step of providing is received by a debugging program for use by said line of software code in said step of executing.

3. The method in claim 1, further including a step of executing a line of software code subsequent to said line of software code executed in said step of executing according to an execution flow corresponding to said software component.

4. The method in claim 1, wherein said hardware operation includes a read operation.

5. The method in claim 1, wherein said hardware operation includes a write operation.

6. The method in claim 1, further including a step of providing a debugging program to perform said step of executing said line of software code within said software component.

7. The method in claim 1, wherein said software component includes an applications software program.

8. The method in claim 1, wherein said software component includes lines of software code that comprises a hardware driver.

9. The method in claim 1, further including a step of providing a plug-in module to perform said step of determining whether said line of software code requires interaction with a hardware device.

10. The method in claim 1, further including a step of providing a plug-in module for associating said line of software code with an interface module if said line of software code requires interaction with a hardware device.

11. The method in claim 1, further including a step of providing a hardware simulator for simulating said hardware device using said hardware model.

12. The method in claim 1, further including a step of providing a debugging program to perform said step of executing said next line of software code according to an execution flow corresponding to said software component.

13. The method in claim 1, further including a step of responding to an interrupt signal generated by said hardware model, said step of responding including a step of redirecting said interrupt signal to a simulated target operating system.

14. A method of performing hardware software co-verification, comprising the steps of:

obtaining a software component having a plurality of lines of software code, and having at least one of said lines of software code capable of making a hardware device interaction when executed;

executing said line of software code within said software component;

flagging said line with a breakpoint, if said line requires a hardware device interaction, wherein said breakpoint for indicating said line requires said hardware device interaction when executed;

associating said line with an interface module by a plug-in, if said line requires said hardware device interaction;

simulating said hardware device with a hardware model running under simulation;

using said interface module to make a request for a hardware operation from said hardware model running under simulation when said line requires said hardware device interaction; and providing data generated by said hardware model running under simulation in response to said request; and executing a next line of software code according to an execution flow corresponding to said software component.

15. The method in claim 14, wherein said hardware operation includes a read operation.

16. The method in claim 14, wherein said hardware operation includes a write operation.

17. The method in claim 14, wherein said software component includes an applications software program.

18. The method in claim 14, wherein said software component includes lines of software code that comprises a hardware driver.

19. The method in claim 14, further including a step of providing a plug-in module to perform said step of determining whether said line of software code requires interaction with a hardware device.

20. The method in claim 14, further including a step of providing a plug-in module for associating said line of software code with an interface module if said line of software code requires interaction with a hardware device.

21. The method in claim 14, further including a step of providing a hardware simulator for simulating said hardware device using said hardware model.

22. The method in claim 14, further including a step of responding to an interrupt signal generated by said hardware model, said step of responding including a step of redirecting said interrupt signal to a simulated target operating system.

23. A method for determining whether a software component and a hardware device are properly designed to interact with each other, comprising the steps of:

preparing a hardware software co-verification system for operation by obtaining a software component having a plurality of lines of software code, and flagging at least one line of software code within said software component, said line of software code capable of making a hardware call when executed;

executing said software component;

sensing by a debugging program during said step of executing whether said line of software code within said software component has been flagged;

associating by a plug-in an interface module and a hardware model that are suitable for servicing said hardware call and redirecting said hardware call to said interface module for servicing, if said step of sensing results in identifying said line of software code previously flagged, wherein said line of software code requiring said hardware call;

using said interface module to receive and modify said hardware call into a compatible device specific format with said hardware model, and to provide necessary signals to communicate said hardware call to said hardware model according to said device specific format, said hardware model responding to said hardware call by simulating signals responsive to said hardware call; and returning execution to the next line of software code awaiting execution within said hardware model running under simulation.

24. The method in claim 23, wherein said step of executing includes using a debugging program to execute said software component one line of software code at a time according to an execution flow dictated said software component.

25. The method in claim 23, wherein said step of flagging a line of software code is performed manually.

26. The method in claim 23, wherein said step of flagging a line of software code is performed through program control.

27. The method in claim 23, further including a step of responding to an interrupt signal generated by said hardware model, said step of responding including a step of redirecting said interrupt signal to a simulated target operating system.

* * * * *

UNITED STATES PATENT AND TRADEMARK OFFICE
CERTIFICATE OF CORRECTION

PATENT NO.    : 6,188,975 B1                                              Page 1 of 1
DATED         : February 13, 2001
INVENTOR(S)   : Donald L. Gay It is certified that error appears in the above-identified patent and that said Letters Patent is hereby corrected as shown below:

Column 3,
Line 50, replace "3gigabytes" with -- 3 gigabytes --.

Signed and Sealed this

Seventh Day of January, 2003

JAMES E. ROGAN
*Director of the United States Patent and Trademark Office*